United States Patent [19]

Steele

[11] Patent Number: 4,973,794
[45] Date of Patent: Nov. 27, 1990

[54] CABLE ASSEMBLY FOR AN ELECTRICAL SIGNAL TRANSMISSION SYSTEM

[75] Inventor: Douglas S. Steele, West Chester, Ohio

[73] Assignee: General Electric Company, Cincinnati, Ohio

[21] Appl. No.: 264,912

[22] Filed: Oct. 31, 1988

Related U.S. Application Data

[62] Division of Ser. No. 80,289, Jul. 31, 1987, Pat. No. 4,835,394.

[51] Int. Cl.$^5$ .......................... H01B 7/34; H01B 7/08
[52] U.S. Cl. ...................................... 174/36; 174/103; 174/117 F
[58] Field of Search .............. 174/36, 103, 104, 117 F

[56] References Cited

U.S. PATENT DOCUMENTS

| | | | |
|---|---|---|---|
| 3,340,353 | 9/1967 | Mildner | 174/36 |
| 3,390,357 | 6/1968 | Thomson | 174/103 |
| 3,651,243 | 3/1972 | Hornor et al. | 174/103 X |
| 3,681,515 | 8/1972 | Mildner | 174/36 X |
| 3,795,540 | 3/1974 | Mildner | 174/105 B X |
| 4,096,346 | 6/1978 | Stine et al. | 174/36 |
| 4,234,759 | 11/1980 | Harlow | 174/104 |
| 4,327,246 | 4/1982 | Kincaid | 174/36 |
| 4,398,058 | 8/1983 | Gerth et al. | 174/36 X |
| 4,468,089 | 8/1984 | Brorein | 350/96.23 |
| 4,475,006 | 10/1984 | Olyphant, Jr. | 174/36 |
| 4,479,059 | 10/1984 | Morris et al. | 250/385.1 |
| 4,510,346 | 4/1985 | Bursh, Jr. et al. | 174/36 |
| 4,570,071 | 2/1986 | Sippel et al. | 250/385.1 |
| 4,588,852 | 5/1986 | Fetterolf et al. | 174/36 |
| 4,599,483 | 7/1986 | Kuhn et al. | 174/103 X |
| 4,613,313 | 9/1986 | Steele | 445/28 |
| 4,678,865 | 7/1987 | Sherwin | 174/103 X |
| 4,719,319 | 1/1988 | Tighe et al. | 174/103 |
| 4,751,614 | 6/1988 | Mehnert | 174/36 |
| 4,755,629 | 7/1988 | Beggs et al. | 174/34 |
| 4,835,394 | 5/1989 | Steele | 174/117 F X |

FOREIGN PATENT DOCUMENTS

| | | |
|---|---|---|
| 82700 | 6/1983 | European Pat. Off. . |
| 257855 | 3/1988 | European Pat. Off. . |
| 374537 | 6/1932 | United Kingdom ................ 174/103 |
| 1440396 | 6/1976 | United Kingdom . |
| 2059669 | 9/1980 | United Kingdom . |
| 2046500 | 11/1980 | United Kingdom . |
| 2157063 | 3/1985 | United Kingdom . |

*Primary Examiner*—Morris H. Nimmo
*Attorney, Agent, or Firm*—Jerome C. Squillaro; Nathan D. Herkamp

[57] ABSTRACT

A cable assembly for an electrical signal transmission system comprises a plurality of elongated conductors, a conductive shield surrounding each conductor, and a dielectric layer between each shield and its respective conductor. The shielded conductors are embedded in a dielectric material and the dielectric material is wrapped in a double conductive shield. Adhesive layers are located between the double shield and the dielectric material and between the two shields making up the double shield. This cable assembly results in a signal transmission apparatus which has increased immunity to the effects of external electromagnetic fields, electrostatic charge, and mechanical vibration. It is particularly useful in transmitting low level signals produced by ionization detectors used in x-ray inspection apparatus.

6 Claims, 1 Drawing Sheet

CABLE ASSEMBLY FOR AN ELECTRICAL SIGNAL TRANSMISSION SYSTEM

This is a division of application Ser. No. 080,289, filed Jul. 31, 1987, now U.S. Pat. No. 4,835,394.

FIELD OF THE INVENTION

This invention relates to electrical signal transmission. More specifically, this invention relates to electrical signal transmission with reduced noise and distortion.

In one specific example of the invention, charge resulting from ionization of dielectric by electromagnetic energy is transferred by way of a cable assembly from an ionization detector to a charge storage apparatus. Transfer of charge by way of the cable assembly occurs with reduced introduction of spurious signals due to electromagnetic or electrostatic interference or mechanical vibrations.

BACKGROUND OF THE INVENTION

It has been found advantageous to inspect manufactured parts such as jet engine turbine blades by passing penetrating radiation such as x-rays through those inspected parts using equipment as described and claimed in U.S. Pat. No. 4,835,394, the parent of the present case, which is hereby incorporated herein by reference. The intensity of the penetrating radiation after having passed through a part indicates the nature of the part and may be used to create an image of the part so that any flaws or defects may be observed.

Reliable observation of flaws in parts such as turbine blades requires a high degree of resolution in any detector of penetrating radiation used in such inspection systems. To achieve high resolution, an ionization detector in the form of a sealed chamber containing closely spaced detector elements and pressurized dielectric such as xenon gas is used. Radiation that has passed through the part being inspected is admitted to the chamber through a radiation permeable window. The radiation admitted to the chamber ionizes the dielectric to an extent related to its intensity. The charge created by that ionization is collected upon the detector elements and transmitted to charge storage circuitry outside the ionization detector, which may be a charging circuit comprising a resistor in series with a capacitor. Part of the circuitry involved in transmitting such charge may include a flexible electric cable connecting the ionization detector with the charge storage circuitry. Because many detector elements must be connected with charge storage circuitry, this cable is most conveniently in the form of one or more ribbon cables each containing a row of closely spaced parallel conductors. Each of the conductors is electrically connected to a detector element and to a resistor in series with a capacitor.

The amount of charge created in such ionization detectors is very small. The current resulting from transfer of that amount of charge to the storage circuitry is on the order of picoamperes. The circuitry associated with the collection and storage of such small amounts of charge is particularly prone to phenomena which may adversely impact the accurate transmission of charge from the ionization detector to the charge storage circuitry. Thus, it is particularly difficult to ascertain the true amount of penetrating radiation entering the ionization detector which makes it difficult to produce accurate images of a part being inspected.

Factors which have been found to impair the accurate transmission of charge created in the ionization detector are numerous and difficult to eliminate. Those factors include electromagnetic interference such as that produced by fluorescent lighting in the vicinity of the inspection apparatus. They also include problems caused by electrostatic charge build up and discharge in the vicinity of the inspection apparatus. To give some idea of the magnitude of this electrostatic charge based problem, merely combing one's hair in close proximity to the transmission system (e.g. 5-10 feet away) influences the charge transfer process. Clothing, such as polyester clothing, which tends to pick up an electrical charge, likewise influences the charge transfer process when worn by people in the same vicinity of the inspection apparatus. An additional difficulty in accurately transferring charge from the ionization detector is caused by mechanical vibration in the vicinity of the circuitry through which the charge flows. Even breathing near or walking past the inspection apparatus has a noticeable effect.

None of these phenomena can be entirely eliminates from the environment of the inspection equipment. Therefore, efforts must be made to increase the immunity of the circuitry involved in charge transfer to the effects of those phenomena. Any significant length of flexible cable used for transferring charge is particularly susceptible to the ill effects of the phenomena described above. Accordingly, ways of increasing the immunity of the cable to the effects of phenomena which may distort signals from the ionization detector that flow through the cable are desirable.

One way to try to avoid the problems with using flexible cable is to shield each of the conductors in the cable. Such a cable in the form of a ribbon cable having a number of individually shielded conductors is available commercially and was tried as a solution to those problems. However, it was found that shielding only the individual conductors in a ribbon cable is insufficient. The next thing that was tried was to wrap an additional conductive shield around the entire shielded cable. It was found that this arrangement helped to reduce the electrostatically based interference, but the electromagnetically based interference and the vibrationally induced interference were still unacceptable. An additional conductive shield was then wrapped around the first shield. This additional shield reduced the electromagnetic interference to acceptable levels, but the inspection apparatus was still subject to vibrational effects. It was only after the first shield was adhered to the cable and the second shied was adhered to the first shield in accordance with the invention of this application that the effects of the vibrational problems were also reduced to acceptable levels.

The invention of this application thus reduces the effects of external interference on signals carried by electric cables. As is apparent from the description below, this may be accomplished in a simple and inexpensive manner through straightforward assembly of readily available components. The invention of this application is useful in any situation where interference with accurate signal transmission is a concern. It is particularly useful in situations involving low level signals, such as those encountered in the transmission of signals from ionization detectors used in high resolution inspection apparatus.

SUMMARY OF THE INVENTION

It is an object of the invention to avoid the problems of signal transmission systems described above, particularly those problems involved with the transmission of low level signals over flexible cable.

It is also an object of the invention to provide a signal transmission apparatus with reduced response to the effects of external interference caused by electromagnetic fields, electrostatic charge, and mechanical vibration.

It is an additional object of the invention to provide a signal transmission apparatus which has reduced signal distortion and noise.

It is a further object of the invention to provide a signal transmission apparatus in the form of a cable assembly which has a uniform, easily controlled impedance.

Other objects and advantages of the invention are either specifically described elsewhere in this application or are apparent from the description of the invention.

In accordance with those objects and advantages, the invention of this application relates to an electric cable assembly which comprises a plurality of elongated conductors oriented such that the axes of the conductors are generally parallel. Each of those conductors is surrounded by a conductive shield separated from its respective conductor by a dielectric layer. A dielectric material encases the plurality of shielded conductors. A first conductive shield surrounds the dielectric material and is attached to the dielectric material by way of a first adhesive layer between the first conductive shield and the dielectric material. A second conductive shield surrounds the first conductive shield and is attached to the first conductive shield by way of a second adhesive layer between the first and second shields.

In a more specific example of the invention, the cable assembly defined above is a part of a signal transmission apparatus which transfers charge resulting from ionization of dielectric in a sealed chamber to charge storage apparatus outside the chamber.

DETAILED DESCRIPTION OF THE INVENTION

Figure 1:
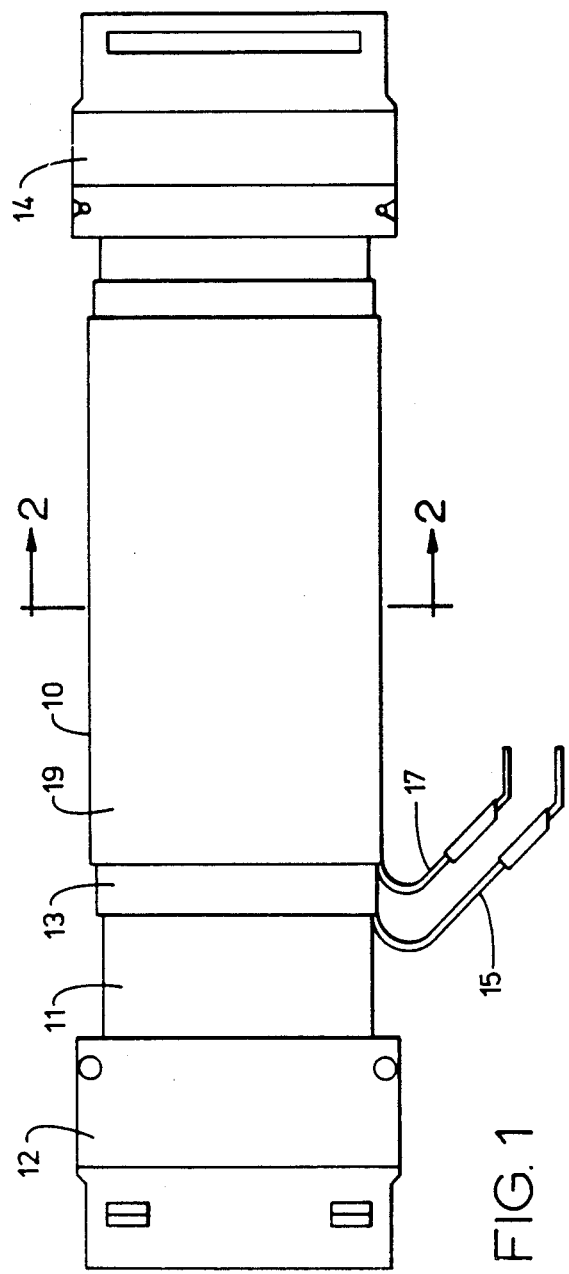
FIG. 1 is a top view of an example of an electric cable assembly in accordance with the invention.
Figure 3:
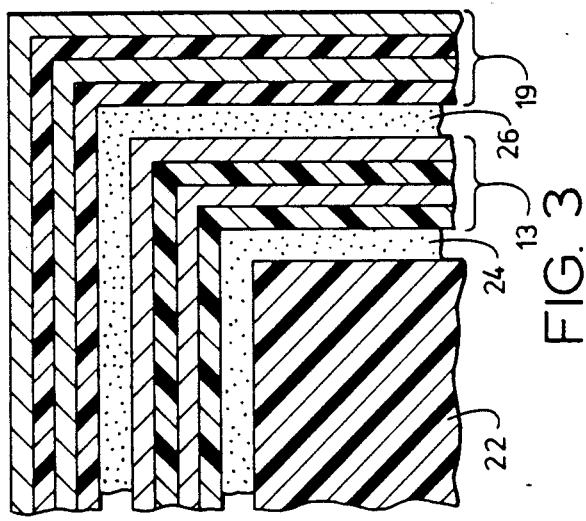
FIG. 3 is a partial cross-sectional view of FIG. 1 showing the first and second shields as laminates.

FIG. 1 shows an electric ribbon cable assembly in accordance with the invention of this application. The cable assembly comprises a center ribbon shaped section 10 and two multiple pin connectors 12 and 14 attached to the ends of the center section. The center section comprises a centrally located shielded ribbon cable 11, a first shield 13 wrapped completely around the ribbon cable 11, and a second shield 19 wrapped completely around the first shield 13. The first and second shields are connected to drain wires 15 and 17, terminated in spade lugs, which are to be connected to a circuit ground.

The ribbon cable 11 contains a row of elongated conductors insulated from one another. Each conductor is terminated in either a male or female conductive member in the connectors 12 and 14 to facilitate electrical connection of the conductor to other circuitry. Such electrical connection may be accomplished by plugging the connector at one end of the cable assembly to a mating connector which is connected to the other circuitry. For example, the mating connector may be mounted on a printed circuit board and connected to conductive tracks associated with the circuit board. The connector at the other end of the cable assembly may also be plugged into a mating connector.

The cable assembly shown in FIG. 1 may thus be used to connect a plurality of electrical circuits together. As more fully explained below, the signals transmitted along the cable assembly of FIG. 1 will be less affected by external interference than signals transmitted along prior cables.

Figure 2:
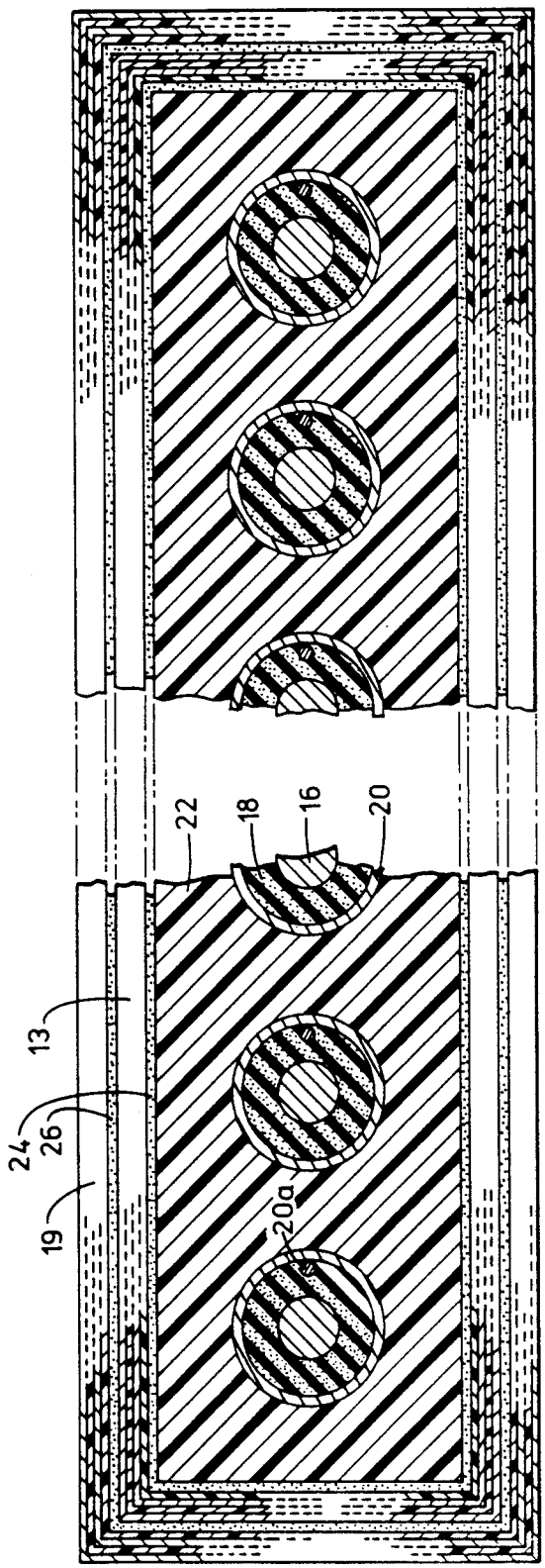
FIG. 2 is a cross sectional view of the FIG. 1 cable assembly taken along line 2—2 in FIG. 1.

FIG. 2 is a cross section of the cable assembly of FIG. 1. It illustrates the structure of the center section 10 of the cable assembly. That structure comprises a row of generally cylindrical conductors 16. The longitudinal axes of the conductors are generally parallel to each other. A tubular dielectric layer 18 insulates and separates each conductor 16 from a conductive shield 20 which surrounds each conductor. The shields are to be connected to circuit ground by means of drain wires 20a. The row of shielded conductors is encased, and insulated from one another, in a dielectric material 22.

The conductors may be any good conductive material such as copper. The dielectric layer may be any good insulator such as a foamed polyethylene dielectric. The shield may be any material known to be suitable for use as a shield, such as aluminized Mylar ® film. The dielectric material 22 may be polyvinyl chloride.

The structure described thus far comprises the ribbon cable 11 of FIG. 1. An example of such ribbon cable may be a 17 conductor Model No. 1-226464-7 coaxial ribbon cable manufactured by AMP, Incorporated. The connectors 12 and 14 may be Model No. 1-226733-4 connector kits also manufactured by AMP, Incorporated.

The first, inner shield 13, which may be a laminate of copper and polyester, for example, a Model No. B-03E060 shield manufactured by W. L. Gore & Associates, Inc., is adhered to the ribbon cable 11 by a layer of adhesive 24. The adhesive may be a light to medium tack transfer adhesive, such as 3M brand 924 adhesive.

In assembling the shield 13 to the ribbon cable 11, a uniform layer of the adhesive is applied to the entire surface of the ribbon cable 11 which will be covered by the shield 13. Application of the adhesive preferably is accomplished with a 3M brand ATG-752 gun used according to the manufacturer's directions. After application of the adhesive to the ribbon cable, the shield then is wrapped uniformly about the ribbon cable.

The aim in applying a layer of adhesive to the ribbon cable and wrapping the shield about the ribbon cable is to get uniform and complete contact between the ribbon cable and the shield over their entire surface areas without air pockets or other gaps between the cable and the shield. This results in uniform impedance per unit length along the entire length of the cable assembly. It also results in the shield being securely fixed with respect to the ribbon cable along the entire length of the cable assembly which is helpful in preventing the shield from shifting with respect to the ribbon cable.

The second, outer shield 19, may also be a copper polyester laminate, for example, a Model No. B-03E070 shield manufactured by W. L. Gore & Associates, Inc.

It is adhered to the first shield 13 by a layer of adhesive 26, which may be the same adhesive used for layer 24. The shield 19 is adhered to the shield 13 in the same manner as shield 13 is adhered to ribbon cable 11 to provide complete and uniform contact between shields 13 and 19 and to prevent shifting of the shields with respect to each other and to the ribbon cable.

It has been found that the cable assembly described above reduces the effects of external interference on signals carried by the cable, which is particularly desirable when those signals are low level signals such as those produced by ionization detectors in inspection apparatus using penetrating radiation. It has been found that the inner shied reduces the effects of electrostatically based interference and the outer shield reduces the effects of electromagnetically based interference.

It also has been found that the adhesive renders the cable rigid and prevents shifting of the shields with respect to each other and with respect to the ribbon cable, which reduces the effects of mechanical vibrations on the cable assembly. Mechanical vibration tends to change the geometry of the cable assembly, which changes the cable assembly's capacitance. Variation of this capacitance causes noise or distortion to be superimposed on a signal being carried by the cable assembly. The rigidity of the cable assembly and the resistance to shifting of the shields keeps the capacitance of the cable assembly constant even in the presence of mechanical vibrations.

The electric cable assembly described in connection with FIGS. 1 and 2 is particularly advantageous in conducting the charge from detector elements to charge storage circuitry. It reduces the effects of external electromagnetic fields and electrostatic charges which can quite significantly influence the low level signals involved in such an apparatus. It also resists deformation caused by mechanical vibrations in the vicinity of the cable assembly, which results in an unchanging cable capacitance. Thus, spurious signals impressed on the cable assembly due to mechanical vibrations are reduced. This is particularly important in an apparatus based on charge transfer to storage capacitors such as the apparatus of U.S. Pat. No. 4,835,394. Because of all the factors mentioned above, the signal passed along the cable is a more accurate indication of the amount of penetrating radiation entering the chamber of the ionization detector.

I claim:

1. An electric cable assembly, comprising:
   a plurality of elongated conductors oriented such that the longitudinal axes of the conductors are generally parallel to each other;
   a conductive shield surrounding each of the conductors, each of the shields being separated from its respective conductor by a dielectric layer;
   a dielectric material encasing and separating the plurality of shielded conductors;
   a first conductive shield surrounding the dielectric material and attached to the dielectric material by way of a first adhesive layer between the first conductive shield and the dielectric material; and
   a second conductive shield surrounding the first conductive shield and attached to the first conductive shield by way of a second adhesive layer between the first conductive shield and the second conductive shield.

2. The cable assembly of claim 1, in which the adhesive layers are comprised of light to medium tack transfer adhesive.

3. The cable assembly of claim 2, in which each of the first and second shields is a laminate of copper and polyester.

4. The cable assembly of claim 1, in which each of the first and second shields is a laminate of copper and polyester.

5. The cable assembly of claim 1, in which the axes of the conductors are arranged so that the cable assembly is in the form of a ribbon.

6. The cable assembly of claim 1, in which the conductive shields surrounding the conductors, the first conductive shield, and the second conductive shield are connected to drain wires to be connected to a circuit ground.

* * * * *